United States Patent
Jeong et al.

(10) Patent No.: US 6,192,429 B1
(45) Date of Patent: Feb. 20, 2001

(54) MEMORY DEVICE HAVING A CONTROLLER CAPABLE OF DISABLING DATA INPUT/OUTPUT MASK (DQM) INPUT BUFFER DURING PORTIONS OF A READ OPERATION AND A WRITE OPERATION

(75) Inventors: Woo-seop Jeong, Kyungki-do; Yong-cheol Bae, Seoul, both of (KR)

(73) Assignee: Samsung Electronics Co., Ltd. (KR)

( * ) Notice: Under 35 U.S.C. 154(b), the term of this patent shall be extended for 0 days.

(21) Appl. No.: 09/103,078

(22) Filed: Jun. 23, 1998

(30) Foreign Application Priority Data

Jun. 26, 1997 (KR) .................................................. 97-27608

(51) Int. Cl.⁷ ........................... G11C 7/06; G11C 11/407; G11C 11/409
(52) U.S. Cl. ........................ 710/58; 365/189.08; 365/227
(58) Field of Search .................................... 365/226, 227, 365/189.05, 189.08; 711/105, 106, 154; 710/58

(56) References Cited

U.S. PATENT DOCUMENTS

| | | | |
|---|---|---|---|
| 5,473,572 | * 12/1995 | Margeson, III | 365/227 |
| 5,610,874 | 3/1997 | Park et al. | 365/236 |
| 5,631,871 | * 5/1997 | Park et al. | 365/203 |
| 5,696,729 | * 12/1997 | Kitamura | 365/227 |
| 5,787,457 | * 7/1998 | Miller et al. | 711/105 |
| 5,808,961 | * 9/1998 | Sawada | 365/233 |
| 5,930,177 | * 7/1999 | Kim | 365/189.05 |

* cited by examiner

*Primary Examiner*—Thomas C. Lee
*Assistant Examiner*—Ilwoo Park
(74) *Attorney, Agent, or Firm*—Myers Bigel Sibley & Sajovec

(57) ABSTRACT

An integrated circuit memory device includes a DQM input buffer controller that enables the DQM buffer to process the DQM mask signal during a row active period of a read operation and a write operation of an integrated circuit memory device, and during a latency period of the read operation and the write operation, and that disables the DQM buffer otherwise during the read operation and the write operation. Thus, the DQM buffer is enabled to process the DQM mask signal during those portions of the read and write operations in which the external DQM mask signal is received and the DQM buffer is otherwise disabled during the read and write operations. The controller can also disable the DQM buffer during a refresh operation of the memory device and a power-down operation of the memory device. Accordingly, reduced current consumption in the DQM buffers may be obtained by only enabling the DQM input buffers when a DQM mask signal is expected during the read and write operations of the memory device.

20 Claims, 4 Drawing Sheets

MEMORY DEVICE HAVING A CONTROLLER CAPABLE OF DISABLING DATA INPUT/OUTPUT MASK (DQM) INPUT BUFFER DURING PORTIONS OF A READ OPERATION AND A WRITE OPERATION

FIELD OF THE INVENTION

This invention relates to integrated circuit memory device, and more particularly to integrated circuit memory devices that include a data input/output mask (DQM) input buffer and methods of operating the same.

BACKGROUND OF THE INVENTION

Integrated circuit memory devices are widely used in consumer and a commercial applications. More specifically, conventional read/write memory devices such as dynamic random access memory devices (DRAM) are often used as part of a data processing system that includes a central processing unit (CPU). It may be difficult to operate a conventional DRAM at speeds that are compatible with the overall system speed. In order to allow a DRAM to operate at high speed, "synchronous" DRAMs, also referred to as SDRAMs have been developed. A synchronous DRAM can receive a system clock that is synchronous to the processing speed of the overall system. The internal circuitry of the SDRAM can be operated in such a manner as to accomplish read/write operations in synchronism with the system clock. Thus, for example, in an SDRAM, a row active signal and a read/write command may be input in synchronization with the system clock. SDRAMs are described in U.S. Pat. No. 5,610,874 to Park et al. entitled "Fast Burst-Mode Synchronous Random Access Memory Device", assigned to the assignee of the present application, the disclosure of which is hereby incorporated herein by reference.

It is also known to use a data input/output mask (DQM) signal that is applied from external to the integrated circuit, in order to mask output data from the memory cell array during a read operation and to mask input data to the memory cell array during a write operation. More specifically, if the DQM signal is applied when the output data is generated by an output driver during a read operation, the read DQM latency is equal to 2. Accordingly, the second generated output data from the time the DQM signal is applied, is masked. On the other hand, the write DQM latency is equal to 0 during the write operation, to prevent the enabling of a column select line corresponding to an address to which the DQM signal is applied. Accordingly, the writing of data to the corresponding memory cell is masked.

The DQM signal that is applied from external to the integrated circuit, is often a Transistor Transistor Logic (TTL) signal. In contrast, an SDRAM generally includes complementary metal oxide semiconductor (CMOS) logic levels. The TTL DQM signal is converted to CMOS levels using a DQM input buffer that generally includes a differential amplifier. A DQM input buffer that responds to a DQM signal is described in detail in U.S. Pat. No. 5,631,871 to Park et al. entitled "System for Selecting One of a Plurality of Memory Banks for Use in an Active Cycle and All Other Banks For an Inactive Precharge Cycle", assigned to the assignee of the present application, the disclosure of which is hereby incorporated herein by reference. It will also be understood that DQM input buffers and DQM signals may also be used in other integrated circuit memory devices.

The number of data bits that are simultaneously input to or output from an integrated circuit memory device has generally increased as the integration density of memory devices has increased. Accordingly, as the number of data input/output pins increases, the number of DQM input buffers may also generally increase. Due to the increase in the number of DQM input buffers that are present in integrated circuits, the current consumption of the DQM buffers may also increase. Accordingly, it is desirable to reduce the current consumption in the individual DQM input buffers.

FIG. 1 is a schematic block diagram of a conventional SDRAM including a DQM input buffer controller that can reduce the current consumption of an associated DQM input buffer. More specifically, as shown in FIG. 1, a DQM input buffer 11 is responsive to a DQM signal DQM and generates an output signal PDQM that is applied to the memory cell array 13 of the integrated circuit memory device. When the output signal PDQM is active during a read operation, the output of data from the memory cell array 13 of the SDRAM is masked.

As shown in FIG. 1, a controller 15 produces an enable signal EN that is applied to the DQM input buffer 11 to enable and disable the DQM input buffer 11. The controller 15 includes a NOR gate and generates the enable signal EN in response to a refresh signal RFS and a power-down signal PWD.

When either the refresh signal RFS or the power-down signal PWD is activated to logic "high", the enable signal EN becomes logic "low" and the DQM input buffer 11 is disabled. Accordingly, the output signal PDQM of the DQM input buffer 11 becomes inactive. Conversely, when the refresh signal RFS and the powerdown signal PWD are both inactivated to logic "low", the enable signal EN becomes logic "high" and the DQM input buffer 11 is enabled. Thus, the DQM signal can be input to the DQM input buffer 11. In summary, in a conventional SDRAM, when either the refresh signal RFS or the power-down signal PWD becomes active, the DQM input buffer 11 is disabled, thus reducing the current consumption of the DQM input buffer 11.

However, as described above, the number of DQM input buffers in integrated circuit memory devices has continued to increase. Accordingly, it is desirable to further reduce the current consumption in each DQM input buffer.

SUMMARY OF THE INVENTION

It is therefore an object of the present invention to provide improved controllers and methods for DQM input buffers of integrated circuit memory devices.

It is another object of the present invention to provide DQM buffer controllers and methods that can allow reduction of the current consumed by the DQM input buffer.

These and other objects are provided according to the present invention, by providing a DQM input buffer controller that enables the DQM buffer to process the DQM mask signal during a row active period of a read operation and a write operation of an integrated circuit memory device, and during a latency period of the read operation and the write operation, and that disables the DQM buffer otherwise during the read operation and the write operation. Stated differently, the DQM buffer is enabled to process the DQM mask signal during those portions of the read and write operations in which the external DQM mask signal is received and the DQM buffer is otherwise disabled during the read and write operations The controller can also disable the DQM buffer during a refresh operation of the memory device and a power-down operation of the memory device. Accordingly, reduced current consumption in the DQM buffers may be obtained by only enabling the DQM input buffers when a DQM mask signal is expected during the read and write operations of the memory device.

Integrated circuit memory devices according to the invention include a memory cell array that can function as memory means and a DQM input buffer that can function as masking means that is responsive to an external DQM mask signal to mask output data from the memory cell array during a read operation and to mask input data to the memory cell array during a write operation. A controller can function as means for enabling and disabling the DQM buffer. The DQM buffer is enabled to process the DQM mask signal during a row active period of the read operation and the write operation, and during a latency period of the read operation and the write operation. The controller also disables the DQM buffer otherwise during the read operation and the write operation.

Controlling methods according to the present invention enable the DQM input buffer to process the DQM mask signal during a row active period of the read operation and the write operation and during a latency period of the read operation and the write operation. The DQM input buffer is disabled otherwise during the read operation and the write operation.

DQM input buffer controllers and controlling methods according to the invention can enable the DQM buffer in response to at least one of a row active signal, a first column address strobe (CAS) latency signal, and the combination of a latency signal and a second CAS latency signal, being active. The row active signal becomes active in response to an external row active command, and becomes inactive in response to a precharge command. The first CAS latency signal becomes active when the number of external clock signals between the external input of a read command and the output of read data is 1. The second CAS latency signal becomes active when the number of external clock signals between the external input of a read command and output of read data is more than 4. Finally, the latency signal becomes active after an external column address is received. As also described above, the controller and controlling methods may also disable the DQM buffer during a refresh operation of the memory device and during a power down operation of the memory device.

The DQM input buffer preferably includes an amplifier and a current source that supplies current to the amplifier. In order to control this type of DQM input buffer, the controller preferably enables the current source during a row active period of the read operation and the write operation and during a latency period of the read operation and the write operation, and disables the current source otherwise during the read operation and the write operation.

In one embodiment, the controller includes a first logic gate that ANDs the latency signal and the second CAS latency signal and a second logic gate that ORs the row active signal in the output of the first logic gate. A third logic gate NORs a refresh signal and a power down signal of the memory device and a fourth logic gate ANDs the outputs of the second and third logic gates. The output of the fourth logic gate enables and disables the DQM buffer. By disabling the DQM input buffers except when they are needed to respond to a DQM signal, reduced current consumption in the DQM input buffers may be obtained.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 2:
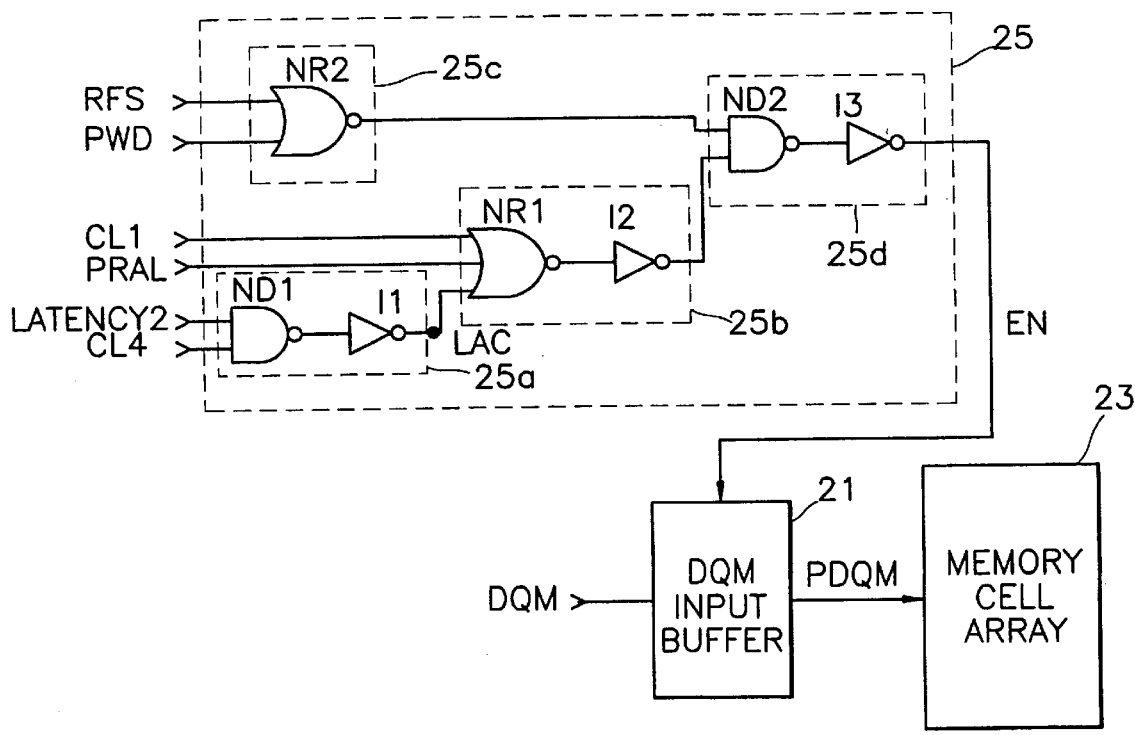
FIG. 2 is a schematic block diagram of an SRAM including a controller for a data input/output mask input buffer according to the present invention.

In FIG. 2, the SDRAM includes a memory cell array 23, a DQM input buffer 21 and a controller 25. The DQM input buffer 21 buffers a DQM signal DQM applied from outside the integrated circuit, under the control of an enable signal EN, to generate an output signal PDQM. The controller 25 activates the enable signal EN, only when at least one of a row active signal PRAL, a first column address strobe (CAS) latency signal CL1, and a signal LAC obtained by ANDing a latency signal LATENCY2 and a second CAS latency signal CL4, are active, and while a refresh signal RFS and a power down signal PWD are both inactive, to enable the DQM input buffer 21. Other peripheral circuits may also be included.

When the output signal PDQM is activated to logic "high" during a read operation, the output of predetermined data from the memory cell 23 is masked. Also, when the output signal PDQM is activated to logic "high" during a write operation, the writing of a predetermined input data into the memory cell array 23 is masked.

The refresh signal RFS is activated to logic "high" when the SDRAM goes into a refresh mode. The power down signal PWD is activated to logic "high" when the SDRAM goes into a power down mode. The row active signal PRAL is activated to logic "high" when a row active command is input from outside the SDRAM, and is deactivated to logic "low" when a precharge command is input. The first CAS latency signal CL1 is activated to logic "high" when the number of external clock cycles between the input of a read command from outside the SDRAM and the output of output data, also referred to as the CAS latency, is equal to "1." The second CAS latency signal CL4 is activated to logic "high" when the CAS latency is equal to "4." The latency signal LATENCY2 is generated in the integrated circuit to control an output buffer, after a column address is input from external to the SDRAM, and which is used when the CAS latency is equal to "2."

As shown in FIG. 2, the controller 25 includes a first logic gate 25a for ANDing the latency signal LATENCY2 and the second CAS latency signal CL4 to generate a signal LAC, and a second logic gate 25b for ORing the row active signal PRAL, the first CAS latency signal CL1 and the signal LAC. A third logic gate 25c NORs the refresh signal RFS and the power down signal PWD, and a fourth logic gate 25d ANDs the output signals of the second and third logic gates 25b and 25c to generate the enable signal EN. The first logic gate 25a includes a NAND gate ND1 and an inverter I1 connected in series, and the second logic gate 25b includes a NOR gate NR1 and an inverter I2 also connected in series. The third logic gate 25c includes a NOR gate NR2, and the fourth logic gate 25d includes a NAND gate ND2 and an inverter I3. The first through fourth logic gates 25a, 25b, 25c and 25d may be implemented using different logic circuits.

Figure 3:
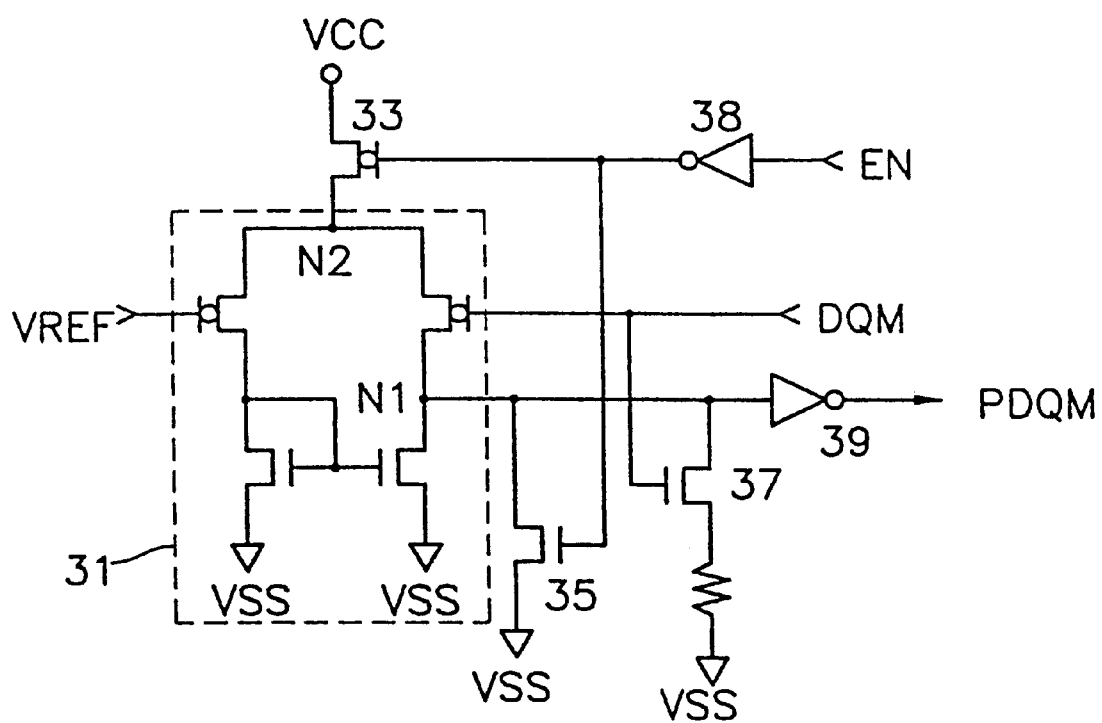
FIG. 3 is a circuit diagram showing an example of the data input/output mask input buffer of FIG. 2.

The DQM input buffer 21 includes a differential amplifier. FIG. 3 shows an example of the DQM input buffer 21.

Referring to FIG. 3, the DQM input buffer 21 includes an amplifier 31, an inverter 38, a current source 33, an inverter 39, and two NMOS pull-down transistors 35 and 37. The amplifier 31 amplifies the voltage level of the DQM signal DQM. The inverter 38 inverts the enable signal EN. The current source 33 connects a power supply terminal N2 of the amplifier 31 to a power supply voltage VCC, in response to the output signal of the inverter 38. The inverter 39 inverts the signal output from an output terminal N1 of the amplifier 31 to generate the output signal PDQM. The NMOS pull down transistor 35 pulls down the voltage of the output terminal N1 to the ground voltage VSS, in response to the output signal of the inverter 38. The NMOS pull down transistor 37 pulls down the voltage level of the output terminal N1 to the ground voltage VSS, in response to the DQM signal DQM.

Thus, when the enable signal EN is activated to logic "high", the current source 33, here a PMOS transistor, is turned on to enable the amplifier 31. Then, the amplifier 31 compares the DQM signal DQM applied from outside the chip with a reference voltage VREF, to generate the output signal PDQM.

Figure 4A:
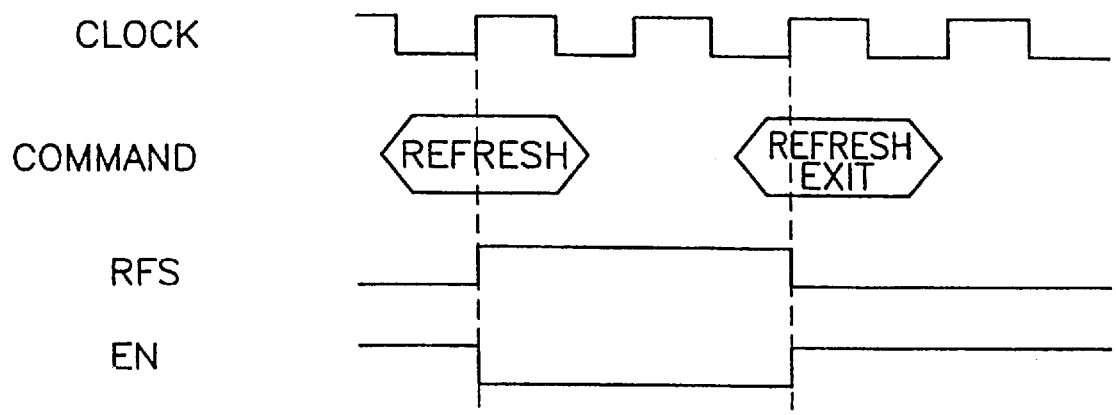
FIGS. 4A through 4C are timing diagrams illustrating operations of the controller and the data input/output mask input buffer of FIG. 2.
Figure 4B:
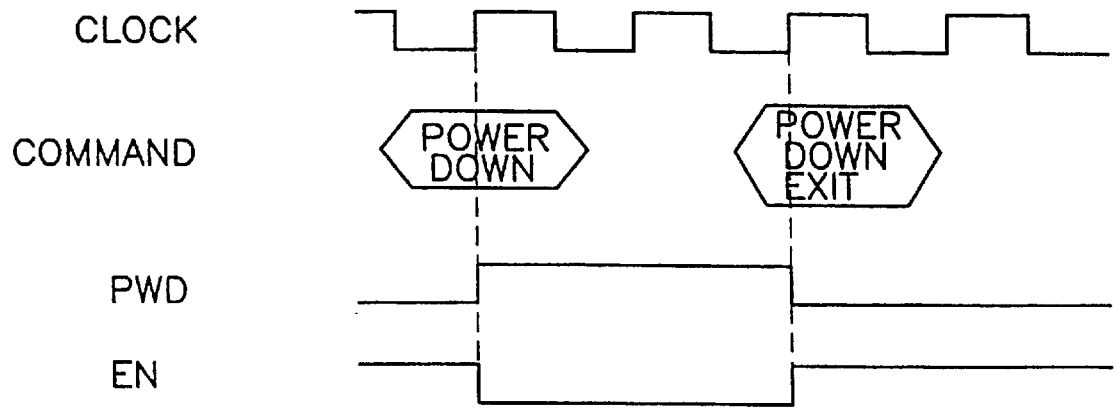
Figure 4C:
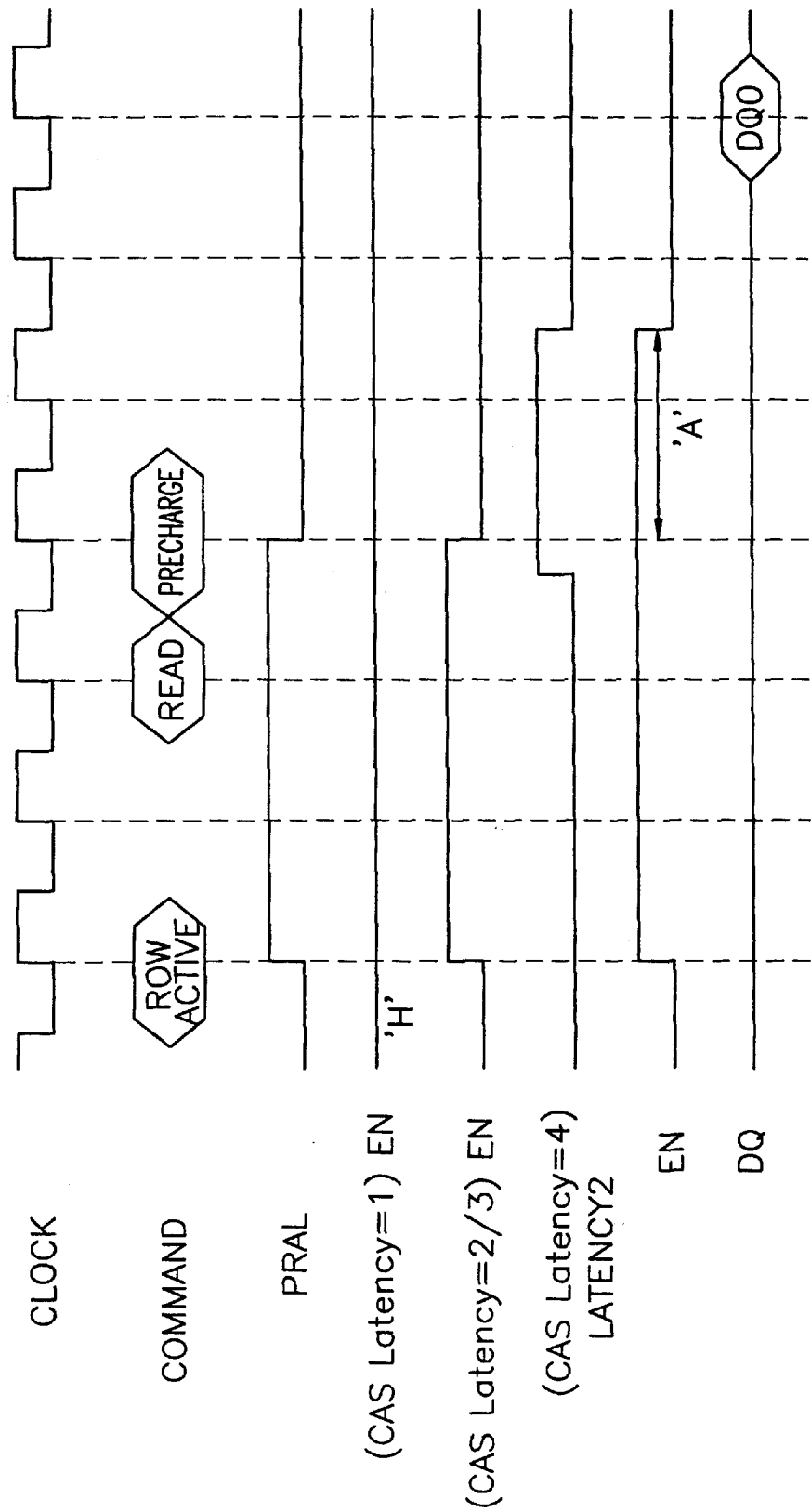

FIGS. 4A through 4C are timing diagrams illustrating operations of the controller 25 and the DQM input buffer 21 of FIG. 2.

Referring to FIG. 4A, the refresh signal RFS is activated to logic "high" when the refresh command is input from external to the SDRAM. Accordingly, the output signal of the controller 25, that is, the enable signal EN, is deactivated to logic "low", so that the DQM input buffer 21 is disabled and the output signal PDQM of the DQM input buffer 21 is deactivated. Then, the refresh signal RFS is deactivated to logic "low" when a refresh exit command is input from external to the SDRAM. As a result, the enable signal EN is activated to logic "high", so that the DQM input buffer 21 is enabled and the DQM signal DQM is input to the DQM input buffer 21.

Stated differently, the read and write operations do not occur and the data input/output masking operation has no effect, in the refresh mode. Thus, it does not matter that the DQM input buffer 21 is disabled during the refresh mode. The DQM input buffer 21 is therefore disabled, to allow a reduction in current consumption.

Figure 1:
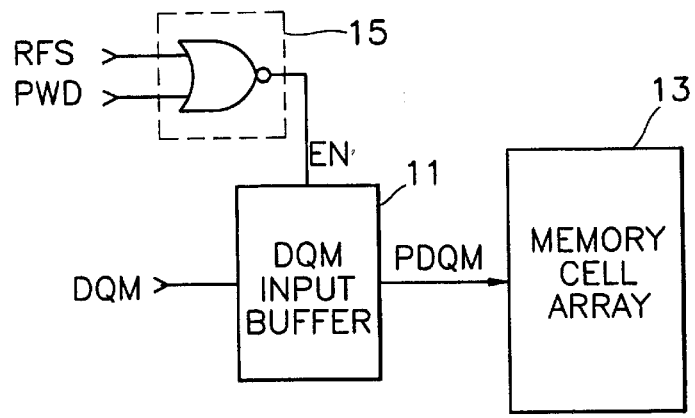
FIG. 1 is a schematic block diagram of a conventional SDRAM including a controller for a data input/output mask input buffer.

Referring to FIG. 4B, when the power down command is input from outside the SDRAM, the power down signal PWD is activated to logic "high." Accordingly, the enable signal EN is deactivated to logic "low", so that the DQM input buffer 21 is disabled and the output signal PDQM of the DQM input buffer 21 becomes inactive. Then, the power down signal PWD is inactivated to logic "low" when the power down exit command is input from outside the SDRAM. As a result, the enable signal EN is activated to logic "high", so that the DQM input buffer 21 is enabled and the DQM signal DQM is input to the DQM input buffer 21. Stated differently, all operations in the SDRAM stop and the data input/output masking operation has no effect, in the power down mode. Thus, it does not matter that the DQM input buffer 21 is disabled during the power down mode. The DQM input buffer 21 is therefore disabled to allow a reduction in current consumption. As described, the disabling of the DQM input buffer 21 in the refresh and power down modes may be the same as that of the conventional SDRAM shown in FIG. 1.

Referring to FIG. 4C, the enable signal EN becomes active to enable the DQM input buffer 21 only when at least one of the row active signal PRAL, the first CAS latency signal CL1, and the signal LAC obtained by ANDing the latency signal LATENCY2 and the second CAS latency signal CL4 are activated to logic "high", while the refresh signal RFS and the power down signal PWD are both inactivated to logic "low". Stated differently, if the row active signal PRAL, the first CAS latency signal CL1 and the signal LAC obtained by ANDing the latency signal LATENCY2 and the second CAS latency signal CL4 are all inactivated to logic "low", the DQM input buffer 21 is disabled even though the memory is not in the refresh and power down modes. Accordingly, except during the row active period and the latency period of read/write operations, the input buffer 21 may be disabled, to thereby allow reduction in current consumption In detail, when the row active signal PRAL is activated to logic "high" by receiving the row active command from external to the SDRAM, the enable signal EN is activated to logic "high" to enable the DQM input buffer 21. Then, when the row active signal PRAL is deactivated to logic "low" by receiving a precharge command, the enable signal EN is inactivated to logic "low" to disable the DQM input buffer 21. Thus, the DQM input buffer 21 is enabled such that the data input/output masking operation can be performed only in the row active period. Since the data input/output masking operation is not performed in the precharge period, the DQM input buffer 21 is disabled in the precharge period, to allow reduction in current consumption.

When the CAS latency is equal to "1," that is, the first CAS latency signal CL1 is logic "high" and the second CAS latency signal CL2 is logic "low," the enable signal EN is activated to logic "high," so that the DQM input buffer 21 is enabled. That is, when a cycle of the clock CLOCK is long and the CAS latency is equal to "1", the DQM signal DQM should be applied at the same time as the row active command in order to mask initial data. Thus, when the CAS latency is equal to "1," the DQM input buffer 21 is enabled such that the data input/output masking operation is performed. When the CAS latency is equal to "2" or "3," the first and second CAS latency signals CL1 and CL4 are both logic "low." In this case, the state of the enable signal EN follows the state of the row active signal PRAL. That is, when the CAS latency is equal to "2" or "3," the DQM input buffer 21 is enabled such that the data input/output masking operation is performed during the row active period where the row active signal PRAL is logic "high," in order to mask the initial data and the data generated after the precharge period.

Also, when the CAS latency is equal to "4," the first CAS latency signal CL1 is logic "low" and the second CAS latency signal CL4 is logic "high." However, when the CAS latency is equal to "4," initial output data DQ0 is output even after the row active signal PRAL becomes inactive by receiving a precharge command. Accordingly, the data input/output masking operation should be normally performed in this case. Thus, before the row active signal PRAL is deactivated to logic "low," the latency signal LATENCY2 is activated to logic "high" and thus the signal LAC of FIG. 2 is activated to logic "high." As a result, the enable signal EN maintains its active state for the interval "A". Thus, the DQM input buffer 21 remains enabled even after the row active signal PRAL is deactivated to logic "low."

When the CAS latency is greater than "5", the DQM input buffer 21 is controlled using a latency signal LATENCY (CL-2) which is used in a CL (CAS latency)-2. For example, when the CAS latency is equal to "5," a latency signal LATENCY3, which is used when the CAS latency is equal to "3," is used. Also, when the CAS latency is equal to "6," a latency signal LATENCY4, which is used when the CAS latency is equal to "4," is used.

Accordingly, in SDRAM devices having a controller for a DQM input buffer, the DQM input buffer is disabled in the refresh and power down modes. Also, even when not in the refresh and power down modes, the DQM input buffer is disabled in all other periods except the row active period and latency period. Thus, the current consumption of the DQM input buffer can be reduced compared to the conventional case, thereby allowing reduction of current consumption of the SDRAM. It will be understood that the present invention may be used with integrated circuit memory devices other than SDRAM devices that include DQM input buffers.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a memory cell array;
   a data input/output mask (DQM) input buffer that is responsive to an external DQM mask signal to mask output data from the memory cell array during a read operation and to mask input data to the memory cell array during a write operation; and
   a controller that enables the DQM buffer to process the DQM mask signal during those portions of the read and write operations in which the external DQM mask signal is received, and that otherwise disables the DQM buffer during the read and write operations of the integrated circuit memory device.

2. A device according to claim 1 wherein the controller enables the DQM buffer to process the DQM mask signal during a row active period of the read and write operations and during a latency period of the read and write operations, and that disables the DQM buffer otherwise during the read and write operations of the integrated circuit memory device.

3. A device according to claim 1 wherein the controller enables the DQM input buffer in response to at least one of a row active signal, a first column address strobe (CAS) latency signal, and a combination of a latency signal and a second CAS latency signal, being active.

4. A device according to claim 3 wherein the controller also disables the DQM buffer during a refresh operation of the memory device and during a power down operation of the memory device.

5. A device according to claim 3:
   wherein the row active signal becomes active in response to an external row active command and becomes inactive in response to a precharge command;
   wherein the first CAS latency signal becomes active when the number of external clock signals between external input of a read command and output of read data is one;
   wherein the second CAS latency signal becomes active when the number of external clock signals between external input of a read command and output of read data is more than four; and
   wherein the latency signal becomes active after an external column address is received.

6. A device according to claim 1 wherein the DQM input buffer includes a differential amplifier.

7. A device according to claim 1:
   wherein the DQM input buffer includes an amplifier and a current source that supplies current to the amplifier; and
   wherein the controller enables the current source during those portions of the read and write operations in which the external DQM mask signal is received, and otherwise disables the current source during the read and write operations.

8. A device according to claim 4 wherein the controller comprises:
   a first logic gate that ANDs the latency signal and the second CAS latency signal;
   a second logic gate that ORs the row active signal and the output of the first logic gate;
   a third logic gate that NORs a refresh signal and a power down signal of the memory device; and
   a fourth logic gate that ANDs the outputs of the second and third logic gates, the output of the fourth logic gate enabling and disabling the DQM buffer.

9. An integrated circuit memory device comprising:
   memory means;
   means for masking output data from the memory means during a read operation and for masking input data to the memory cell array during a write operation in response to an external DQM mask signal; and
   means for enabling the masking means to process the DQM mask signal during those portions of the read and write operations in which the external DQM mask signal is received, and for otherwise disabling the masking means during the read and write operations of the integrated circuit memory device.

10. A device according to claim 9 wherein the enabling means comprises:
    means for enabling the masking means to process the DQM mask signal during a row active period of the read and write operations and during a latency period of the read and write operations, and for disabling the masking means otherwise during the read and write operations of the integrated circuit memory device.

11. A device according to claim 9 wherein the enabling means comprises means for enabling the masking means in response to at least one of a row active signal, a first column address strobe (CAS) latency signal, and a combination of a latency signal and a second CAS latency signal, being active.

12. A device according to claim 11 wherein the enabling means further comprises means for disabling the masking means during a refresh operation of the memory device and a power down operation of the memory device.

13. A device according to claim 11:
    wherein the row active signal becomes active in response to an external row active command and becomes inactive in response to a precharge command;
    wherein the first CAS latency signal becomes active when the number of external clock signals between external input of a read command and output of read data is one;
    wherein the second CAS latency signal becomes active when the number of external clock signals between external input of a read command and output of read data is more than four; and wherein the latency signal becomes active after an external column address is received.

14. A device according to claim 9 wherein the masking means includes differential amplifying means.

15. A device according to claim 9:

wherein the masking means includes amplifying means and means for supplying current to the amplifying means; and wherein the enabling means comprises means for enabling the means for supplying current during those portions of the read and write operations in which the external DQM mask signal is received, and for otherwise disabling the means for supplying current during the read and write operations.

16. A device according to claim 12 wherein the enabling means comprises:

first means for ANDing the latency signal and the second CAS latency signal;

second means for ORing the row active signal and the output of the first means;

third means for NORing a refresh signal and a power down signal of the memory device; and fourth means for ANDing the outputs of the second and third means, the fourth means enabling and disabling masking means.

17. A method of controlling a data input/output mask (DQM) input buffer of an integrated circuit memory device that is responsive to an external DQM mask signal to mask output data from a memory cell array during a read operation and to mask input data to the memory cell array during a write operation, the controlling method comprising the step of:

enabling the DQM input buffer to process the DQM mask signal only during those portions of the read and write operations in which the external DQM mask signal is received and otherwise disabling the DQM buffer from processing the DOM mask signal during the read and write operations of the integrated circuit memory device.

18. A method according to claim 17 wherein the controlling step comprises the steps of:

enabling the DQM input buffer to process the DQM mask signal during a row active period of the read and write operations and during a latency period of the read and write operations; and disabling the DQM input buffer otherwise during the read and write operations.

19. A method according to claim 18 wherein the enabling step comprises the step of enabling the masking means in response to at least one of a row active signal, a first column address strobe (CAS) latency signal, and a combination of a latency signal and a second CAS latency signal, being active.

20. A method according to claim 18 wherein the disabling step further comprises the step of disabling the DQM buffer during a refresh operation of the memory device and a power down operation of the memory device.

* * * * *